United States Patent
Xiao et al.

(10) Patent No.: US 8,199,829 B2
(45) Date of Patent: Jun. 12, 2012

(54) DECODING SYSTEM AND METHOD

(75) Inventors: Shu Xiao, San Diego, CA (US); Yiliang Bao, San Diego, CA (US); Sitaraman Ganapathy Subramanian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 961 days.

(21) Appl. No.: 12/197,929

(22) Filed: Aug. 25, 2008

(65) Prior Publication Data

US 2010/0046627 A1 Feb. 25, 2010

(51) Int. Cl.
*H04N 11/02* (2006.01)
*G06K 9/36* (2006.01)

(52) U.S. Cl. .................................. 375/240.25; 382/233

(58) Field of Classification Search ......................... None
See application file for complete search history.

(56) References Cited

U.S. PATENT DOCUMENTS

| | | | |
|---|---|---|---|
| 2002/0080874 A1 | 6/2002 | Wilson | |
| 2003/0053700 A1* | 3/2003 | Ishii | 382/233 |
| 2004/0158878 A1 | 8/2004 | Ratnakar et al. | |
| 2004/0193835 A1* | 9/2004 | Devaney et al. | 711/220 |
| 2006/0267907 A1* | 11/2006 | Koyama et al. | 345/98 |
| 2007/0182602 A1* | 8/2007 | Zhan et al. | 341/67 |
| 2008/0025409 A1 | 1/2008 | Tseng et al. | |
| 2008/0055119 A1 | 3/2008 | Sadowski et al. | |

FOREIGN PATENT DOCUMENTS

| | | |
|---|---|---|
| EP | 1581007 A2 | 9/2005 |
| WO | 9854906 | 12/1998 |

OTHER PUBLICATIONS

Cho, Seong et al., "A Low Power Variable Length Decoder for MPEG-2 Based on Nonuniform Fine-Grain Table Partitioning," IEEE Transactions on Very Large Scale Integration (VLSI) Systems, vol. 7, No. 2, Jun. 1999, p. 249-257.
Lee, Sung-Won et al., "A Low-Power Variable Length Decoder for MPEG-2 Based on Successive Decoding of Short Codewords," IEEE Transactions on Circuits and Systems—II: Analog and Digital Signal Processing, vol. 50, No. 2, Feb. 2003, p. 73-82.
International Search Report—PCT/US2009/054946—International Search Authority—European Patent Office, Dec. 29, 2009.
Seong Hwan Cho et al.: "A Low Power Variable Length Decoder for MPEG-2 Based on Nonuniform Fine-Grain Table Partitioning," IEEE Transactions on Very Large Scale Integration (VLSI) Systems, IEEE Service Center, Piscataway, NJ, US, vol. 7, No. 2, Jun. 1, 1999.

* cited by examiner

*Primary Examiner* — Clemence Han
(74) *Attorney, Agent, or Firm* — Elaine Lo

(57) ABSTRACT

Decoding systems and methods are disclosed. In a particular embodiment, a video decoder system includes a first decoding path and a second decoding path configured to decode at a slower average rate than the first decoding path. The video decoder system includes a dynamic switch configured to provide a first portion of the encoded video signal to the first decoding path or to the second decoding path. The dynamic switch is further configured to provide a subsequent portion of the encoded video signal to the first decoding path or to the second decoding path in response to a value of a decoding metric associated with decode processing of the first portion.

26 Claims, 6 Drawing Sheets

DECODING SYSTEM AND METHOD

I. FIELD

The present disclosure is generally related to decoding systems and methods.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, a video player, and an audio file player. Also, such wireless computing devices can process executable instructions, including software applications, such as a web browser application, that can be used to access the Internet. As such, these wireless computing devices can include significant computing capabilities.

Encoded video data may be decoded at such wireless computing devices using a lookup table to translate codewords of signal data. The entire set of codewords may be stored at a lookup table that is activated during each codeword lookup operation to return a fast result, but at the expense of significant power consumption. Because delays decoding video data may be easily noticed by a viewer of the decoded video data, full codeword set table lookups is often performed in spite of the significant drain on limited power resources at a portable device.

III. SUMMARY

In a particular embodiment, a method is disclosed that includes receiving an encoded video signal at a video decoder system. The method includes sending a first portion of the encoded video signal to be decoded at a first decoding path or at a second decoding path of the video decoder system. The second decoding path is configured to use less average power than the first decoding path. The method includes determining a decoding metric associated with decoding the first portion of the encoded video signal. The method also includes selectively sending a subsequent portion of the encoded video signal to be decoded at the first decoding path or at the second decoding path in response to the decoding metric. The method further includes generating a decoded video signal based on the decoding of the first portion and the subsequent portion.

In another particular embodiment, a video decoder system is disclosed that is configured to receive an encoded video signal and is configured to output a decoded video signal. The video decoder system includes a first decoding path and a second decoding path. The second decoding path is configured to decode at a slower average rate than the first decoding path. The video decoder system also includes a dynamic switch configured to either provide a first portion of the encoded video signal to the first decoding path or to the second decoding path. The dynamic switch is further configured to provide a subsequent portion of the encoded video signal to the first decoding path or to the second decoding path in response to a value of a decoding metric associated with decode processing of the first portion.

In another particular embodiment, a system is disclosed that includes a plurality of lookup tables. The plurality of lookup tables includes a first lookup table storing first data corresponding to a complete set of codewords of a variable length coding scheme. The plurality of lookup tables also includes a second lookup table storing second data corresponding to a first incomplete set of the codewords. The system further includes a switch configured to receive a portion of a variable length coding bitstream that includes a first codeword. The switch is configured to send the first codeword to a first selected lookup table of the plurality of lookup tables and to send a subsequent codeword to a second selected lookup table of the plurality of lookup tables in response to a value of a decoding metric associated with decoding the first codeword.

In another particular embodiment, a portable electronic device includes a wireless controller configured to wirelessly receive an encoded high-definition video signal via an antenna. The portable electronic device also includes first means for decoding the encoded high-definition video signal and second means for decoding the encoded high-definition video signal at a slower average speed than the first means and using less average power than the first means. The portable electronic device further includes a selection circuit to dynamically select the first means or the second means in response to a number of undecoded coefficients of a macroblock of the high-definition video signal and further in response to a number of remaining processing cycles available to decode the undecoded coefficients of the macroblock. The selection circuit is configured to select the first means or the second means to decode a particular portion of the macroblock based on the decode processing of at least one prior portion of the macroblock.

One particular advantage provided by disclosed embodiments is efficient decoding that is enabled by dynamic selection of a decoding path based on decode processing of a prior portion of a encoded signal. Efficient decoding can lead to power savings.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
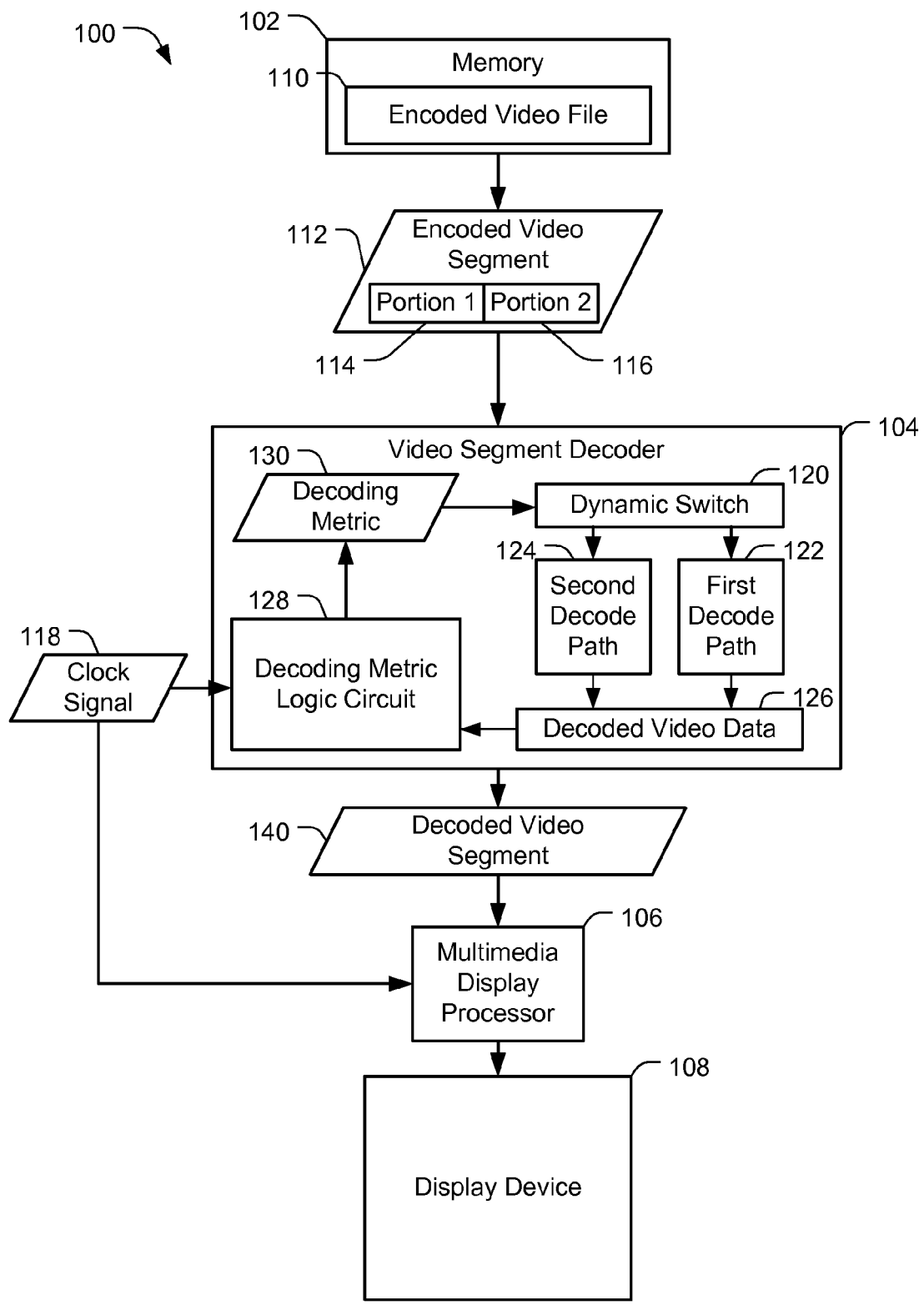
FIG. 1 is a data flow diagram of a first illustrative embodiment of a decoding system.

Referring to FIG. 1, a first illustrative embodiment of a decoding system is depicted and generally designated 100. A memory 102 is coupled to provide an encoded video signal from an encoded video file 110 to a video segment decoder 104. The video segment decoder 104 is coupled to a multimedia display processor 106 that provides output to a display device 108.

The video segment decoder 104 is configured to receive one or more encoded video segments 112 of the encoded video signal and to output decoded video segments 140 of a decoded video signal. The video segment decoder 104 includes a first decoding path 122 and a second decoding path 124. The second decoding path 124 is configured to decode at a slower average rate than the first decoding path 122. The second decoding path 124 may also be configured to use less average power than the first decoding path 122. A dynamic switch 120 is configured to select and to direct portions of the encoded video signal to be decoded at either the first decoding path 122 or the second decoding path 124 based on prior decoding performance of portions of the encoded video signal. Thus, the video segment decoder 104 may dynamically select faster and higher power decoding or slower and lower power decoding, at different stages of decoding as the encoded video signal is being decoded.

Decoded video data 126, decoded via the first decoding path 122, the second decoding path 124, or any combination thereof, is provided to a decoding metric logic circuit 128 and is also used to generate an output video signal. The decoding metric logic circuit 128 is responsive to the decoded video data 126 and to a clock signal 118 to generate a decoding metric 130. The decoding metric 130 is provided to the dynamic switch 120 to enable the switch 120 to determine whether the first decoding path 122 or the second decoding path 124 will be selected. For example, the decoding metric 130 may indicate an amount of time or a number of clock cycles remaining to decode remaining portions of the video signal. As another example, the decoding metric 130 may indicate a number of available clock cycles exceeding a worst-case number of clock cycles required to finish decoding of the video signal. For example, when a known amount of data remains to be decoded, a worst-case number of clock cycles to finish decoding the known amount of data may be determined and compared to an actual number of clock cycles available. The decoding metric 130 may indicate how many clock cycles are available beyond the worst-case requirement.

During operation, the encoded video file 110 may be provided to the video segment decoder 104 as a series of encoded video segments including the representative encoded video segment 112. For example, the encoded video segment 112 may be a macroblock of a high-definition video signal. The video segment decoder 104 may satisfy a data output rate to support high-definition display of the video signal at the display device 108. For example, a specified number of cycles of the clock signal 118 for each macroblock of the video signal may be sufficient to support high-definition display.

The dynamic switch 120 may be configured to dynamically switch from the first decoding path 122 to the second decoding path 124 while decoding a particular macroblock when sufficient time or processing cycles are available to decode at the slower average rate of the second decoding path 124 while maintaining a total video data output rate to support high-definition display of decoded video signal. For example, the dynamic switch 120 may be configured to provide a first portion 114 of the encoded video segment 112 to the first decoding path 122 or to the second decoding path 124, and then to provide a subsequent portion 116 of the encoded video segment 112 to the first decoding path 122 or to the second decoding path 124 in response to a value of the decoding metric 130 associated with decode processing of the first portion 114.

As a particular example, the encoded video segment 112 may correspond to a macroblock of the encoded video signal, the first portion 114 may correspond to a first half of the macroblock and the subsequent portion 116 may correspond to a second half of the macroblock. After the first half of the macroblock is decoded, the dynamic switch 120 may determine if sufficient time is available to decode the second half of the macroblock at the second decode path 124 at a slower rate to conserver power, based on an evaluation of the decoding metric 130. For example, if the decoding metric 130 indicates that sufficient clock cycles are available in excess of a worst-case number of clock cycles to finish decoding, the dynamic switch 120 may select to decode the second half of the macroblock at the second decode path 124. As another particular example, the first portion 114 and the subsequent portion may correspond to individual blocks of encoded data within the macroblock. As yet another particular example, the first portion 114 and the subsequent portion 116 may correspond to individual codewords used to encode the video signal, and the dynamic switch 104 may select the decoding path 122 or 124 on a codeword-by-codeword basis.

As will be discussed in regard to FIG. 4, the decoded video data 126 may be processed to generate a decoded video segment 140 that is provided to the multimedia display processor 106. For example, where the encoded video segment 112 represents a macroblock of an encoded high-definition video signal, the decoded video segment 140 may represent a decoded macroblock of the high-definition video signal. The video segment decoder 104 may operate as one or more stages of a decoding pipeline that operates on a macroblock-by-macroblock basis and may dynamically select between a lower power decoding and a higher speed decoding via the dynamic switch 120 to efficiently decode a signal while maintaining a specified overall output rate.

Figure 2:
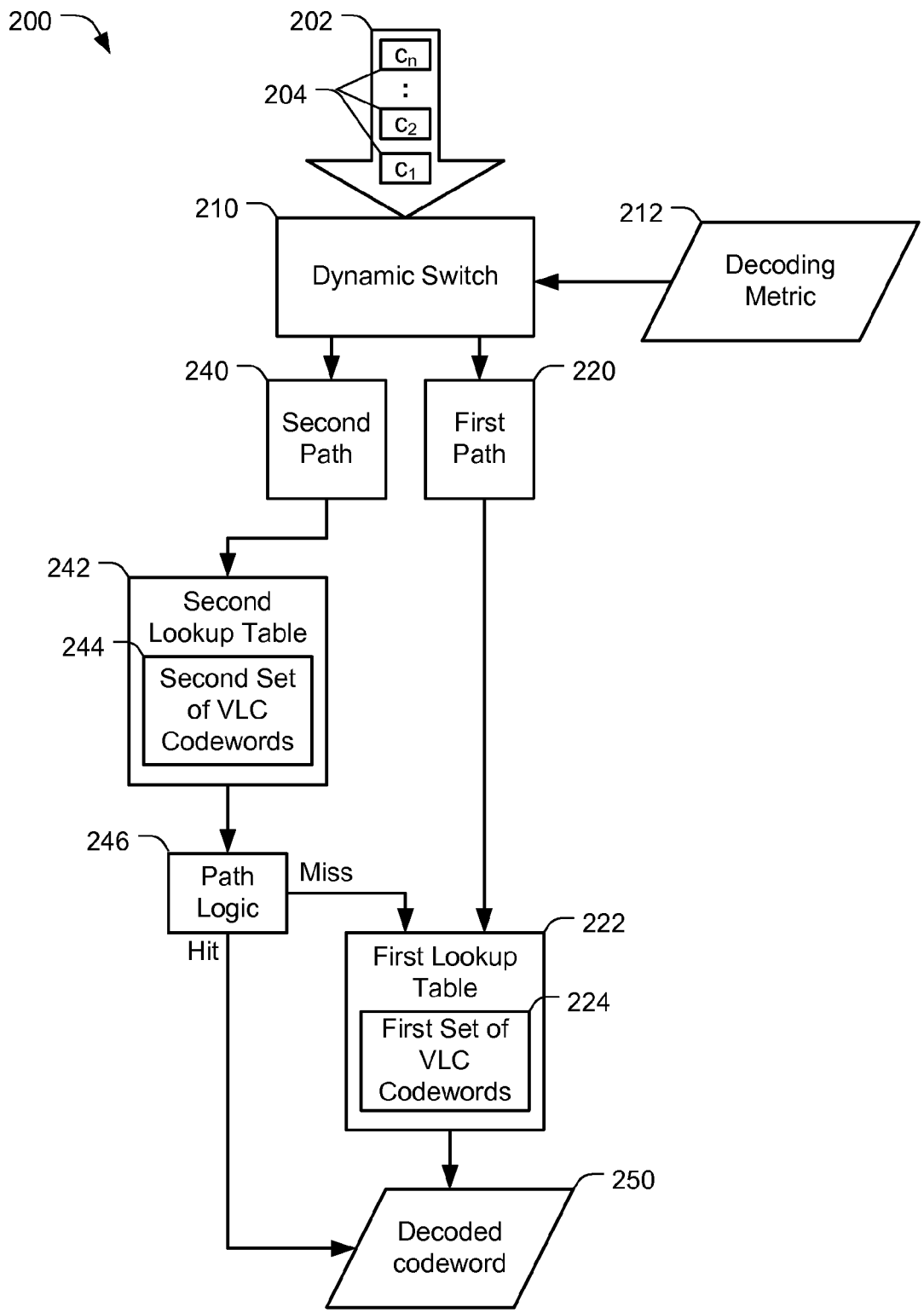
FIG. 2 is a data flow diagram of a second illustrative embodiment of a decoding system.

Referring to FIG. 2, a second illustrative embodiment of data flow through decoding system is depicted and generally designated 200. An encoded video signal 202 is received at a dynamic switch 210. The dynamic switch 210 is coupled to a first decoding path 220 that includes a first lookup table 222. The dynamic switch 210 is also coupled to a second decoding path 240 that includes a second lookup table 242, path logic 246, and the first lookup table 222. In a particular embodiment, the system 200 is implemented as a video decoder system configured to decode an encoded video signal, such as in the video segment decoder 104 of FIG. 1.

The encoded video signal 202 includes a stream of codewords $C_1, C_2, \ldots C_n$ 204 of a variable length coding (VLC) scheme. The dynamic switch 210 is configured to dynamically assign each codeword of the stream of codewords $C_1, C_2, \ldots C_n$ 204 to the first decoding path 220 or to the second decoding path 240 to generate a decoded codeword 250. The dynamic switch 210 may assign each codeword to the first path 220 or to the second path 240 based on a decoding metric 212, which may indicate a current number of processing or clock cycles available to decode a remainder of the encoded video signal 202. For example, the decoding metric 212 may indicate a number of clock cycles remaining to finish decoding a macroblock of a high-definition video signal without exceeding a budgeted amount of time per macroblock or a threshold number of clock cycles, such as to support a desired data output rate for high-definition display.

The first lookup table 222 stores first data corresponding to a first set of VLC codewords 224. The first set of VLC codewords 224 may include a complete set of the codewords of the VLC scheme used to encode the encoded video signal 202. The second lookup table 242 stores second data corresponding to a second set of VLC codewords 244, and includes fewer codewords than the first lookup table 222. The second set of VLC codewords 244 may include an incomplete set of the codewords of the VLC scheme used to encode the encoded video signal 202. The second set of VLC codewords 244 may include short codewords that are statistically likely to be frequently encountered. By storing a smaller set of codewords that are likely to be encountered while decoding video signals, the second lookup table 242 may use significantly less power during each lookup operation than the first lookup table 222, but may result in codewords not being found during lookup operations.

The second decoding path 240 is configured to access the second lookup table 242 prior to accessing the first lookup table 222. Where a lookup operation at the second lookup table 242 results in a codeword being found, i.e. a "hit," the path logic 246 returns the decoded codeword 250. However, where the path logic 246 determines that a miss occurred at the second lookup table 242, the codeword is provided to the first lookup table 222 to perform a second lookup operation.

In a particular embodiment, the decoding metric 212 is updated as each codeword 204 is decoded. The dynamic switch 210 may be configured to select the first decoding path 220 or the second decoding path 240 to decode a particular codeword in response to a value of the decoding metric 212 after decoding a previous codeword. For example, the codeword $C_1$ may be decoded via the first decoding path 220 or the second decoding path 240, the decoding metric 212 may be updated to reflect the decoding of the codeword $C_1$, and the dynamic switch 210 may use the updated decoding metric 212 to select whether to decode the next codeword $C_2$ via the first decoding path 220 or the second decoding path 240.

As another example, as will be explained with respect to FIG. 3, the encoded video signal 202 may include coefficients representing frequency transformed pixels, and the decoding metric 212 may be determined based on an amount of time available to decode remaining coefficients of the encoded video signal 202. The coefficients may be encoded via the stream of codewords $C_1, C_2, \ldots C_n$ 204 so that each codeword encodes information including run information (e.g., a number of zero coefficients) and level information (e.g., a non-zero coefficient value). The number of zero coefficient values may affect an amount of time to decode the encoded video signal 202 by affecting a total number of codewords 204 to be decoded.

During operation, the dynamic switch 210 may be configured to dynamically select the first decoding path 220 or the second decoding path 240 in response to the decoding metric 212. The second decoding path 240 may be selected to decode the encoded video signal 202 using less power on average than the first decoding path 220 and at a slower speed on average than the first decoding path 220. The first decoding path 220 may be selected to decode at a faster speed on average, and consuming more power on average, than the second decoding path 240.

In a particular embodiment, the first set of VLC codewords 224 at the first lookup table 222 is a complete set of VLC codewords, so that every valid codeword 204 provided to the first lookup table 222 is guaranteed to be located via a single lookup operation at the first lookup table 222. To locate any codeword 204 in a single lookup operation, every entry of the first lookup table 222 may be substantially concurrently compared to the codeword 204. In an illustrative example where a one-hundred-codeword VLC scheme is used, one hundred simultaneous comparisons may be performed at the first lookup table 222 for each lookup operation, generating a fast and reliable result but using a relatively large amount of power.

In contrast, the second set of VLC codewords 244 at the second lookup table 242 may include a smaller number of VLC codewords so that each lookup operation performed at the second lookup table 242 uses a smaller amount of power than at the first lookup table 222. The path logic 246 determines if a lookup operation at the second lookup table 242 was successful (i.e., a "hit"), resulting in a decoded codeword 250, or unsuccessful (i.e., a "miss"). If unsuccessful, the path logic 246 routes the codeword 204 that caused the miss to the first lookup table 222, where a hit may be guaranteed.

Where certain codewords 204 of the VLC scheme used to encode the encoded video signal 202 are statistically more likely to be included in the encoded video signal 202 than other codewords, the second set of VLC codewords 244 may be chosen to include the statistically most likely codewords 204 to improve overall efficiency. For example, it may be determined that about 10-15 codewords of a VLC scheme may be statistically likely to correspond to about 70-80% of lookup operations.

In an illustrative embodiment where the first set of VLC codewords 224 includes one hundred codewords and the second set of VLC codewords 244 includes ten codewords that correspond to seventy percent of codeword lookups, an amount of power P may be consumed for a lookup operation at the second lookup table 242. Seventy percent of these lookups are successful, while thirty percent of these lookups are misses that are sent to the first lookup table 222. The first lookup table 222, storing ten times as many codewords, may consume ten times an amount of power as the second lookup table 242 per lookup operation, i.e., 10 P. Thus, an average power consumed for each codeword that is decoded via the second path 240 may be given as $P_{avg}=0.7\,P+0.3(P+10\,P)=4\,P$, while an average number of lookup operations for each codeword that is decoded via the second path 240 may be given as Nlookups=0.7+0.3*2=1.3. These results indicate that, in the illustrative embodiment, on average the second decoding path 240 decodes codewords 30% slower than the first decoding path 220 while using 60% less power than the first decoding path 220. It will be understood that such results arise from a very simplified and generalized analysis of the system 200 to generate a rough comparison of the decoding paths for illustrative purposes only, and in other particular implementations other results may be obtained.

Figure 3:
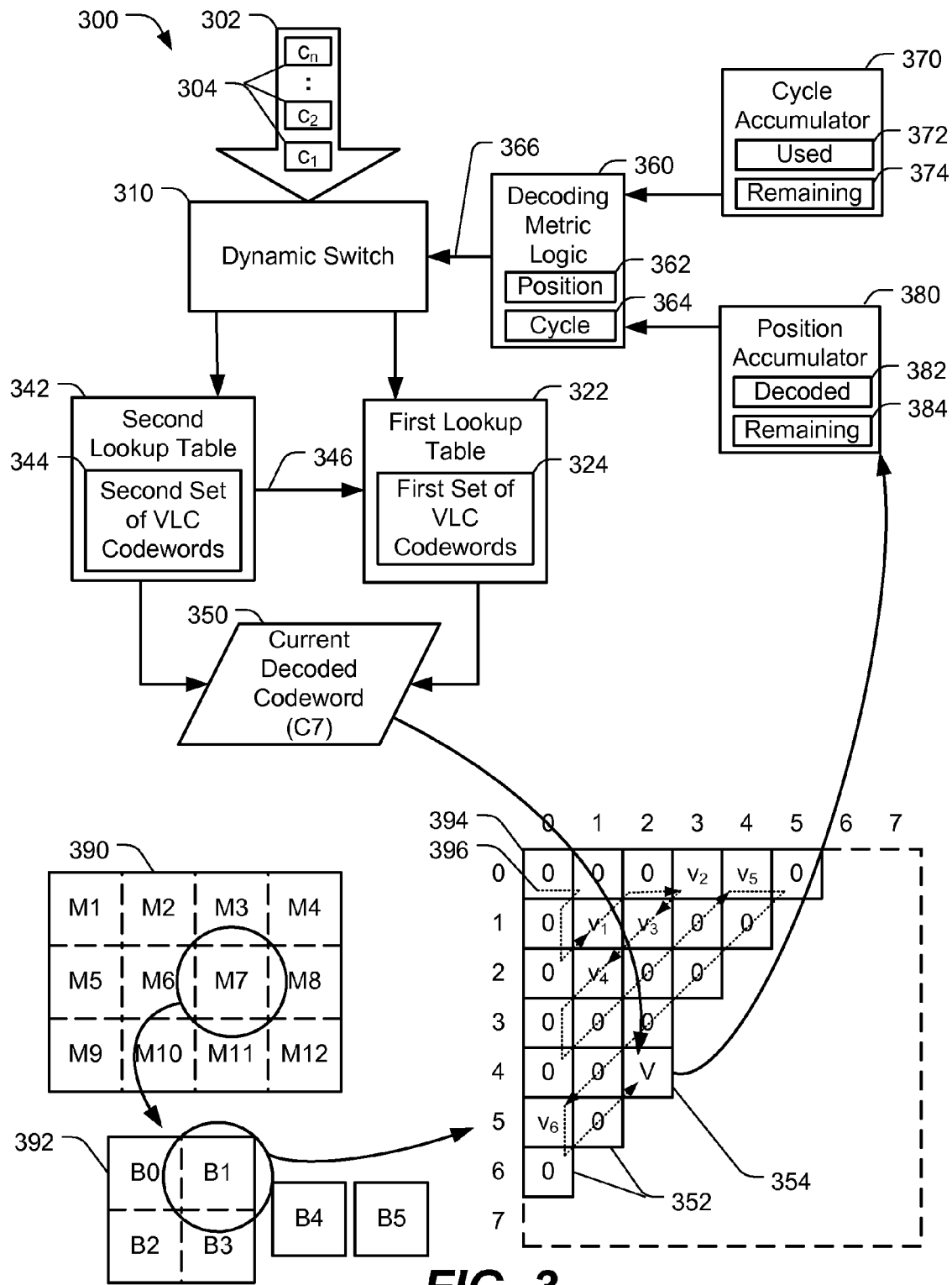
FIG. 3 is a data flow diagram of a third illustrative embodiment of a decoding system.

Referring to FIG. 3, a third illustrative embodiment of data flow through a decoding system is depicted and generally designated 300. In a particular embodiment, the system 300 may be a specific implementation of the system 100 of FIG. 1 or the system 200 of FIG. 2. The system 300 includes a dynamic switch 310 that receives a variable length encoded bitstream 302 that includes a stream of codewords C1, C2, . . . Cn 304. The dynamic switch 310 is configured to provide the codewords 304 to a first lookup table 322 or to a second lookup table 342 based on a value of a decoding metric 366 received from a decoding metric logic circuit 360. The decoding metric logic circuit 360 is responsive to a cycle accumulator circuit 370 and is also responsive to a position accumulator circuit 380.

The first lookup table 322 stores first data corresponding to a first set of codewords 324 of a variable length coding (VLC) scheme. A second lookup table 342 stores second data corresponding to a second set of VLC codewords 344. In a particular embodiment, a lookup operation at the second lookup table 342 consumes less power than at the first lookup table 322. The first lookup table 322 is configured to perform a lookup operation of a particular codeword 346 after the particular codeword 346 is not found at the second lookup table 342. In a particular embodiment, the first set of VLC codewords 324 is a complete set of codewords of a particular VLC scheme, and the second set of codewords 344 is an incomplete set of the codewords.

Each of the first lookup table 322 and the second lookup table 342 is adapted to support lookup operations to return decoded codewords, such as the representative decoded codeword C7 350. Generally, the variable length encoded bitstream 302 may encode a video signal as multiple macroblocks, illustrated as a video image 390 partitioned into twelve representative macroblocks M1-M12. A particular representative macroblock M7 392 is illustrated as including data for six representative blocks B0-B5. In other embodiments, the macroblock M7 392 may include data for more than six blocks. Each block may include coefficient data that corresponds to data of the video image 390. For example, the video image may be encoded using a discrete cosine transform, integer transform, or other method, to transform pixel data to frequency data in a frequency domain, and the blocks B0-B5 may include coefficient data indicating quantized frequency transform values. In a particular embodiment, the representative blocks B0-B3, B4, and B5 may include luma data Y and chroma data Cb and Cr, respectively.

A particular codeword may encode data indicating a number of zero coefficients and a non-zero coefficient value. For example, a partially decoded representative block B1 394 indicates decoded coefficients following a zig-zag pattern 396, illustrated as a sequence of dotted lines, each dotted line representing a codeword that may include any number of zero coefficients (i.e., a run value) and a non-zero coefficient (i.e., level value). A first codeword $c_1$ represents four zero coefficients and a non-zero coefficient having a value $v_1$. A second codeword $c_2$ represents a single zero coefficient and a non-zero coefficient having a value $v_2$. A third codeword $c_3$ represents no zero coefficients and one non-zero coefficient having a value $v_3$. A fourth codeword $c_4$ represents no zero coefficients and one non-zero coefficient having a value $v_4$. A fifth codeword $c_5$ represents five zero coefficients and one non-zero coefficient having a value $v_5$. A sixth codeword $c_6$ represents five zero coefficients and one non-zero coefficient having a value $v_6$. A current decoded codeword, the representative codeword C7 350, represents two zero coefficients 352 and one non-zero coefficient 354 having a value V.

The position accumulator circuit 380 may be configured to indicate a decoding position of a signal encoded in the variable length coding bitstream 302. For example, the position accumulator circuit 380 may be adapted to track a zig-zag location of a current decoding position within a current macroblock and to update a counter indicating a number of decoded coefficients 382, or a counter indicating a number of remaining coefficients 384, or both, of the current macroblock. The position accumulator circuit 380 may update a decoding position in response to each decoded codeword and provide updated values to the decoding metric logic circuit 360.

The cycle accumulator circuit 370 may be configured to indicate a number of processing cycles that have been used to decode the variable length coding bitstream 302. For example, the cycle accumulator circuit 370 may be adapted to update a counter indicating a number of clock cycles used 372 since a beginning of a particular portion of a decoding process, a counter indicating a number of clock cycles remaining 374 to complete the particular portion of the decoding process, or both. The cycle accumulator circuit 370 may update a cycle value in response to each elapsed clock cycle, each decoded codeword, or both, and provide updated values to the decoding metric logic circuit 360.

In a particular embodiment, the decoding metric logic circuit 360 is generally configured to generate the decoding metric 366 based on decoding a first portion of the variable length encoded bitstream 302 by reducing the amount of time available by a number of clock cycles used to decode the first portion and by reducing a remaining coefficient count by a number of coefficients decoded in the first portion. In particular, the decoding metric logic circuit 360 may store updated decoding position data received from the position accumulator circuit 380 at a position storage circuit 362 that includes one or more latches, flip-flops, other storage devices, or any combination thereof. The decoding metric logic circuit 360 may also store updated cycle data received from the cycle accumulator circuit 370 at a cycle storage circuit 364 that includes one or more latches, flip-flops, other storage devices, or any combination thereof. The decoding metric logic circuit 360 may perform one or more arithmetic or logical operations on the stored position data and cycle data to generate the decoding metric 366.

During operation, the dynamic switch 310 is configured to receive a portion of a variable length coding bitstream 302 that includes a first codeword (e.g., $C_1$) and to provide the first codeword to a first selected lookup table 322 or 342. The dynamic switch 310 then provides a subsequent codeword (e.g., $C_2, C_3, \ldots C_n$) to a second selected lookup table 322 or 342 in response to a value of the decoding metric 366 that is associated with decoding the first codeword. In an illustrative embodiment, the codewords 304 are received at a barrel shifter (not shown), and the dynamic switch 310 is configured to send or to provide each codeword 304 to one of the lookup tables 322 or 324 by selectively coupling the barrel shifter to either the first lookup table 322 or the second lookup table 342, such as via one or more multiplexers, crossbars, or other switching circuits.

The variable length coding bitstream 302 may include an encoded high-definition video signal having a plurality of macroblocks, such as the representative macroblocks M1-M12. The decoding metric logic circuit 360 may be configured to initialize the position accumulator circuit 380 and the cycle accumulator circuit 370 at each macroblock, such as where decoding of one macroblock is complete and decoding of a next macroblock is beginning.

As illustrated, each macroblock may contain six blocks, with each block including 8×8=64 coefficient values. Where none of the coefficient values of the block are zero values, the block may be encoded as sixty-four separate codewords. In contrast, where all but the last coefficient of the block (i.e., at position (row, column)=(7,7)) has a zero value, the block may be encoded as a single codeword.

The system 300 may be configured to support a high-definition display rate by ensuring that decoding of each macroblock is performed within a predetermined time period or number of clock cycles, which may operate as a time budget or cycle budget. For example, each macroblock may include six blocks, each block including sixty-four coefficients, which may be encoded as up to sixty-four codewords. Therefore, decoding any particular macroblock may involve decoding up to approximately three hundred eighty four codewords within the time budget for the macroblock.

When decoding of a macroblock begins, such as when decoding of macroblock M6 is complete and decoding of macroblock M7 begins, the position accumulator circuit 380 may be initialized to indicate zero coefficients decoded at the counter indicating a number of decoded coefficients 382, or to indicate three hundred eighty four coefficients remaining to be decoded at the counter indicating a number of remaining coefficients 384, or both. Similarly, the cycle accumulator circuit 370 may be initialized to indicate zero cycles used at the counter indicating a number of clock cycles used 372, a cycle budget at the counter indicating a number of clock cycles remaining 374, or both.

As an illustrative example, for a high-definition video signal with a 1920×1080 resolution at 30 frames per second, decoded at a mobile device processor operating at 128 MHz, each macroblock may have a processing budget of approximately 522 clock cycles. Because additional processing may be required other than coefficient decoding, such as processing header information, the cycle budget to decode each macroblock may be as low as three hundred eighty four cycles. Because in the illustrated embodiment each macroblock is encoded using no more than three hundred eighty four codewords, and because any codeword may be located via a single lookup operation at the first lookup table 322, each macroblock may be reliably decoded within a budget of at least three hundred eighty four cycles.

The decoding metric logic circuit 360 updates the value stored at the position storage circuit 362 and the cycle storage circuit 364, generates a value of the decoding metric 366, and provides the value of the decoding metric 366 to the dynamic switch 310. The value of the decoding metric 366 may indicate a relationship between the remaining amount of an encoded signal to be decoded and the amount of time available to perform the decoding. For example, the decoding metric may indicate a number of cycles remaining in the budget for the particular macroblock minus a number of coefficients remaining to be decoded in the particular macroblock. In such an embodiment, a zero value of the decoding metric may indicate to the dynamic switch that the first lookup table 322 is to be selected to ensure that in a slowest case, (i.e., one codeword for every remaining coefficient) decoding of the macroblock is completed within the cycle budget. However, any positive value of the decoding metric 366 may indicate that at least one additional cycle is available, so that the dynamic switch 310 may select the second lookup table 342 to reduce overall average power consumption, and if a miss occurs at the second lookup table 342, a second lookup operation may be performed at the first lookup table 322 while remaining within the cycle budget.

As each codeword is decoded, the decoding position may be updated based on the number of coefficients encoded by the codeword, the count of clock cycles used or remaining may be updated to reflect the number of cycles used to decode the codeword, and the value of the decoding metric 366 may be updated for the next codeword. In this manner, the system 300 may dynamically switch between lower power, lower speed decoding and higher power, higher speed decoding to substantially reduce power consumption while ensuring a data output rate to support a high definition display.

Although the provided examples of the decoding metric 366 illustrate a particular relationship between decoding position and clock cycles, other relationships may be used. For example, the decoding metric 366 may indicate a difference between used cycles and decoded coefficients (or decoding position), a difference between remaining cycles and remaining coefficients, a ratio of decoded coefficients to used cycles, a ratio of remaining coefficients to remaining cycles, or other relationships such as moving averages, overall statistical results, or any combination thereof. Further, although the provided examples illustrate decoding at a macroblock granularity, i.e., resetting cycle counts and decoding counts for each macroblock, other granularities may be used, such as on a block-by-block basis, or groups of blocks, groups of macroblocks, or any other portion of the variable length encoded bitstream 302, which may be statically or dynamically determined.

Figure 4:
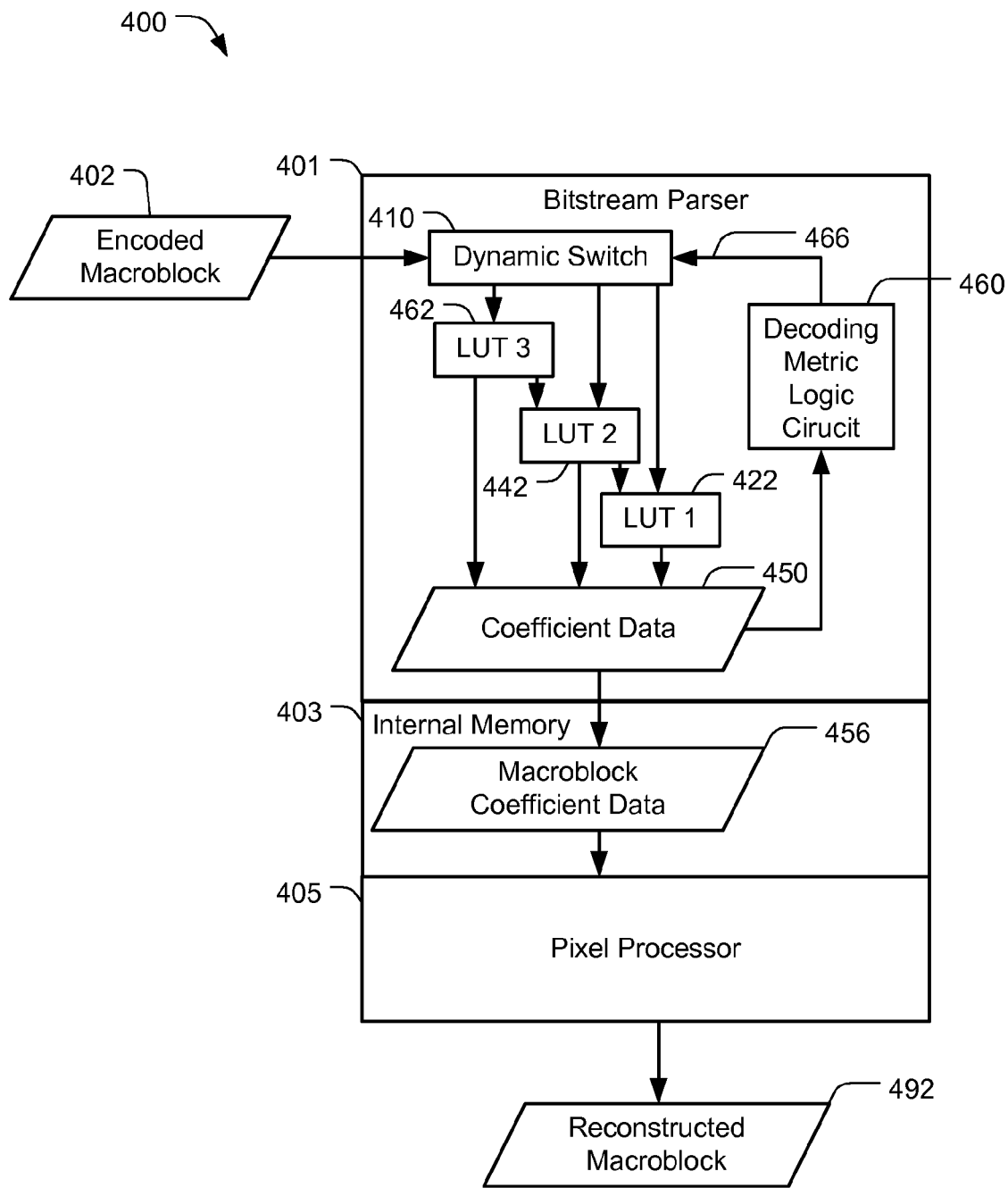
FIG. 4 is a data flow diagram of a particular illustrative embodiment of a decoding pipeline.

Referring to FIG. 4, a particular illustrative embodiment of a decoding pipeline is depicted and generally designated 400. The decoding pipeline 400 includes a bitstream parser stage 401, an internal memory 403, and a pixel processor stage 405. In a particular embodiment, the decoding pipeline 400 is a macroblock decoding pipeline, where the bitstream parser stage 401 is adapted to receive an encoded macroblock 402 and to output macroblock coefficient data 456 to the internal memory 403 during a first pipeline cycle, and the pixel processor stage 405 is adapted to read the macroblock coefficient data 456 from the internal memory 403 and to use the macroblock coefficient data 456 to generate a reconstructed macroblock 492 during the next pipeline cycle. In a particular embodiment, the encoded macroblock 402 includes codewords of an encoded video signal, and the decoding pipeline 400 is implemented as part of a video decoder system.

The bitstream parser stage 401 includes a dynamic switch 410 that is configured to receive the encoded macroblock 402 and that is responsive to a value of a decoding metric 466 provided by a decoding metric logic circuit 460. The dynamic switch 410 selectively provides portions of the encoded macroblock 402 to decode at a selected one of a plurality of lookup tables, including a first lookup table 422, a second lookup table 442, and a third lookup table 462. The first lookup table 422 is configured to perform a lookup operation when a miss occurs at the second lookup table 442. Similarly, the second lookup table 442 is configured to perform a lookup operation when a miss occurs at the third lookup table 462. The lookup tables 422, 442, and 462 generate coefficient data 450 to be stored at the internal memory 403 and that is used by the decoding metric logic circuit 460 in a decoding feedback process. Generally, with the exception of the third lookup table 462, the bitstream parser stage 401 may function substantially as described with respect to any of FIGS. 1-3.

The first lookup table 422 may include a complete set of codewords of a variable length coding (VLC) scheme to provide decoding of any codeword of the VLC scheme via a single lookup operation. The second lookup table 442 may include a smaller set of the codewords that are statistically most likely to be encountered to provide lower power decoding, on average, than the first lookup table 422, but with a possibly longer average decoding time due to misses occurring from a lookup operation at the second lookup table that are resolved via another lookup operation at the first lookup table 422.

The third lookup table 462 may include an even smaller set of the codewords of the second lookup table 442 that are statistically most likely to be encountered to provide even lower power decoding, on average, than the second lookup table 442. A miss occurring at the third lookup table 462 results in a subsequent lookup operation at the second lookup table 442, and possibly a third lookup operation at the first lookup table 422. In another embodiment, when a particular codeword is not found at the third lookup table 462, the particular codeword is sent to the first lookup table 422 or to the second lookup table 442. Although depicted with three lookup tables 422, 442, and 462, in other embodiments the bitstream parser stage 401 may include only two lookup tables, or four or more lookup tables.

Figure 5:
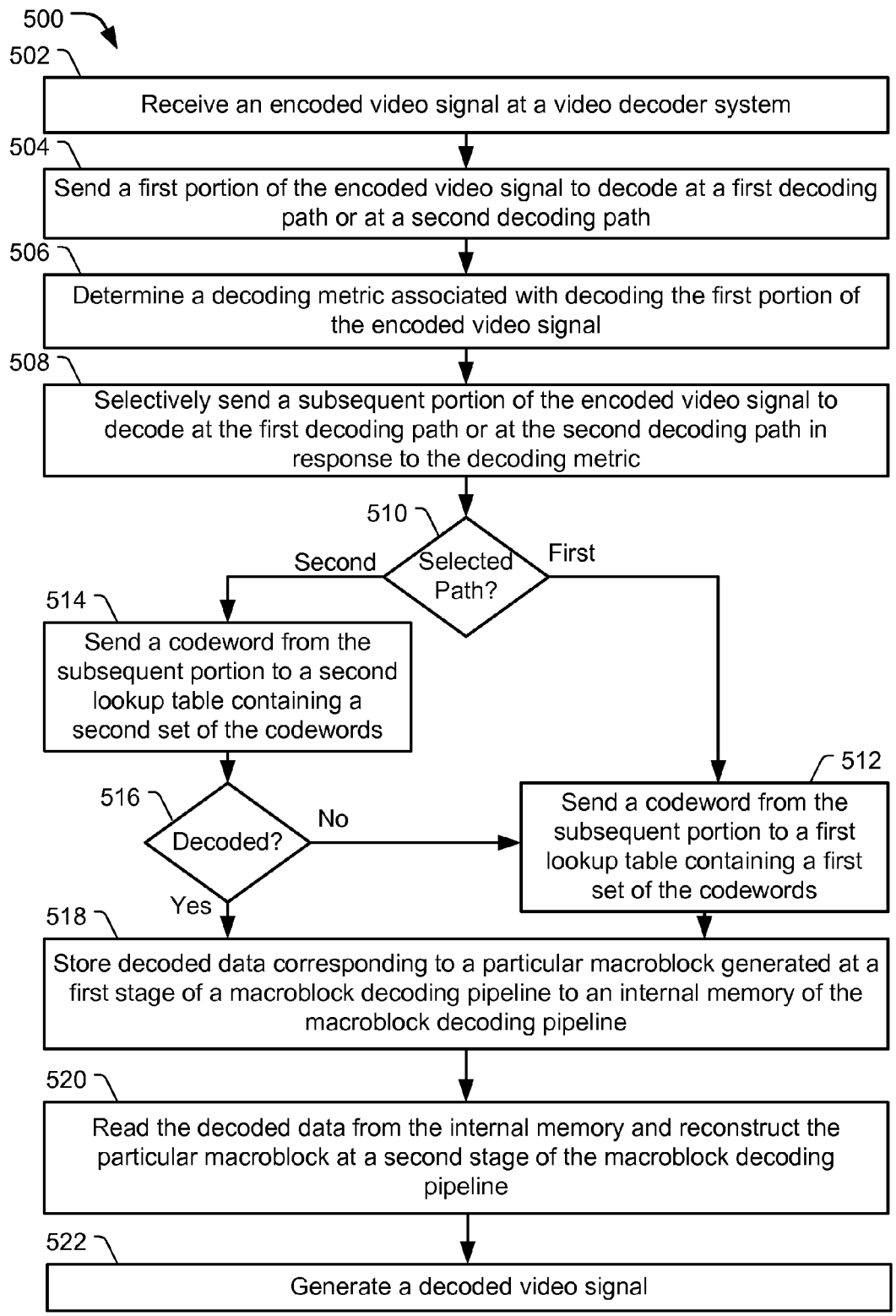
FIG. 5 is a flow chart of a particular illustrative embodiment of a decoding method.

Referring to FIG. 5, a particular illustrative embodiment of a decoding method is depicted and generally designated 500. In a particular embodiment, the method 500 may be performed at any of the systems depicted in FIGS. 1-4.

At 502, an encoded video signal is received at a video decoder system. For example, the encoded video signal may include a stream of codewords of a variable length coding (VLC) scheme, such as the Moving Picture Experts Group (MPEG) encoding standards MPEG-1, MPEG-2, and MPEG-4, or the Society of Motion Picture and Television Engineers (SMPTE) 521M video codec standard ("VC-1"), as illustrative, non-limiting examples.

Proceeding to 504, a first portion of the encoded video signal is sent to be decoded at a first decoding path or at a second decoding path of the video decoder system. The second decoding path is configured to use less average power than the first decoding path. In a particular embodiment, the second decoding path is further configured to decode at a slower average rate than the first decoding path.

Advancing to 506, a decoding metric associated with decoding the first portion of the encoded video signal is determined. For example, the decoding metric may indicate a relationship between an amount of data remaining to be decoded and an amount of time or a number of clock cycles available to decode the data remaining to be decoded.

Continuing to 508, a subsequent portion of the encoded video signal is selectively sent to be decoded at the first decoding path or at the second decoding path, where the selection is in response to the decoding metric. For example, in a particular embodiment, the subsequent portion may be sent to the second decoding path when the decoding metric indicates that sufficient time is available to decode the subsequent portion at the slower average rate and may be sent to the first decoding path otherwise. In a particular embodiment, the first portion of the encoded video signal includes at least a first codeword of a variable length coding scheme and the subsequent portion includes at least a second codeword of a variable length coding scheme.

Moving to 510, a determination is made whether the first decode path or the second decode path is selected. When the first decoding path is selected to decode the subsequent portion, at 510, the second codeword is sent to a first lookup table containing a first set of codewords of the variable length encoding scheme, at 512. For example, the first set of codewords may include a complete set of codewords of a VLC scheme to ensure that every codeword is located in a single lookup operation with no table lookup misses.

When the second decoding path is selected to decode the subsequent portion, at 510, the second codeword is sent to a second lookup table containing a second set of the codewords of the variable length encoding scheme, at 514. The second lookup table includes fewer codewords than the first lookup table. For example, the second lookup table may include a set of codewords of a VLC scheme that are statistically most likely to occur in any encoded bitstream that is encoded using the VLC scheme. Because the second lookup table includes fewer table entries, a lookup operation at the second lookup table may consume less power than at the first lookup table, but may also result in a table lookup miss. At 516, a determination is made whether the second codeword was decoded at the second lookup table. When the second codeword was not decoded at the second lookup table, i.e., a table lookup miss occurred, the second codeword is sent to the first lookup table, at 512.

In a particular embodiment, the first portion and the subsequent portion of the encoded video signal correspond to a particular macroblock of the encoded video signal, and the decoding metric indicates an amount of time available to decode remaining pixels of the particular macroblock to maintain a data output rate to support a high definition display of the decoded video signal. In a particular embodiment, the method continues at 518, where decoded data corresponding to a particular macroblock generated at a first stage of a macroblock decoding pipeline is stored to an internal memory of the macroblock decoding pipeline. The decoded data may be read from the internal memory and the particular macroblock may be reconstructed at a second stage of the macroblock decoding pipeline, at 520. The first stage may generate the decoded data corresponding to the particular macroblock within a predetermined amount of time while the second stage concurrently reconstructs a prior macroblock within the predetermined amount of time.

Moving to 522, a decoded video signal is generated. The decoded video signal is based on decoding the first portion and a second portion (including any subsequent portions) of the encoded video signal and may include one or more macroblocks of a VLC encoding scheme.

As illustrated, decoding the encoded video signal may include dynamically selecting a first decoding path to increase decoding speed or a second decoding path to save power when processing resources are sufficient to enable decoding at a slower speed. Such dynamic selection using the decoding metric, where the decoding metric is based on prior decoding performance, enables reduced power consumption when the decoding process is pipelined while ensuring each pipeline stage does not exceed an allocated resource budget. For example, each pipeline stage may have an allocated budget of processing cycles to process a macroblock of a high-definition video signal and reduced power decoding may be performed while ensuring compliance with the allocated budget of processing cycles.

Figure 6:
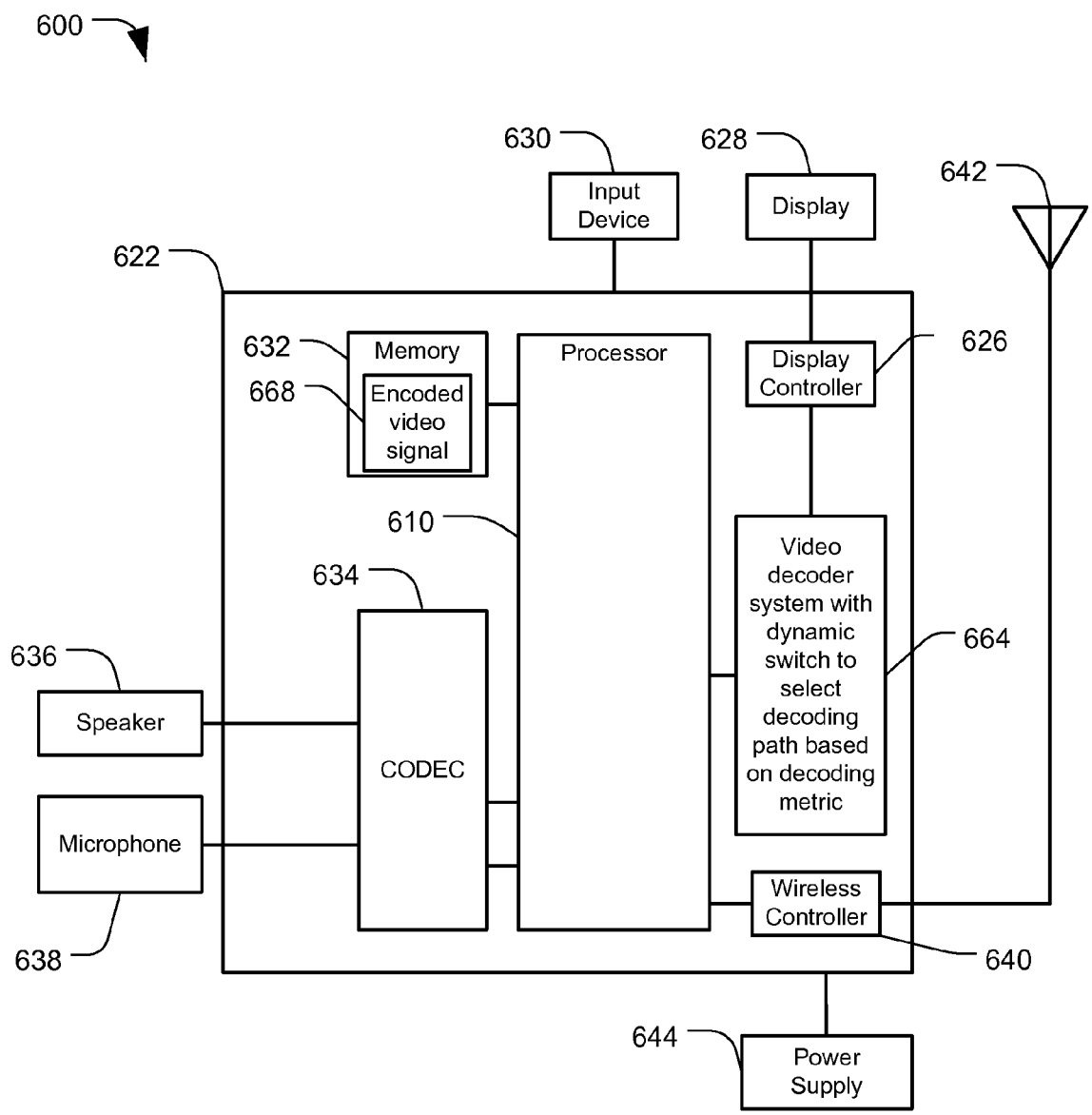
FIG. 6 is a block diagram of a particular illustrative embodiment of a portable electronic device including a video decoder system with a dynamic switch to select a decoding path based on a decoding metric.

Referring to FIG. 6, a particular illustrative embodiment of a portable electronic device is depicted and generally designated 600. The portable electronic device includes a video decoder system with a dynamic switch to select a decoding path based on a decoding metric 664. The portable electronic device 600 includes a processor 610, such as a digital signal processor (DSP), coupled to a memory 632. The processor 610 is also coupled to the video decoder system with a dynamic switch to select a decoding path based on a decoding metric 664. In an illustrative example, the video decoder system with a dynamic switch to select a decoding path based on a decoding metric 664 includes any of the systems depicted in FIGS. 1-4, or may operate in accordance with the method of FIG. 5, or any combination thereof. The portable electronic device 600 may be a phone, a personal digital assistant (PDA), a portable gaming device, a notebook or tablet computer, or any other type of portable electronic device.

FIG. 6 shows a display controller 626 that is coupled to the processor 610 and to a display device 628. An audio coder/decoder (CODEC) 634 can also be coupled to the processor 610. A speaker 636 and a microphone 638 can be coupled to the CODEC 634.

FIG. 6 also indicates that a wireless controller 640 can be coupled to the processor 610 and to a wireless antenna 642. The wireless controller 640 may be configured to receive an encoded high-definition video signal 668 via the antenna 642, and the memory 632 may be configured to store the encoded high-definition video signal 668. The video decoder system with a dynamic switch to select a decoding path based on a decoding metric 664 may be adapted to decode the encoded high-definition video signal 668 and to provide an output video signal to the display controller 626 to display at the display device 628.

The video decoder system with a dynamic switch to select a decoding path based on a decoding metric 664 may decode the encoded high-definition video signal 668 in a manner that dynamically chooses a low power operation that meets display rate requirements. For example, where the encoded high-definition video signal 668 is encoded using a variable length codeword encoding scheme having a minimum data rate display requirement, the video decoder system 664 may choose a faster decoding operation with a higher average power consumption until compliance with the minimum data rate display requirement is assured, and then choose a slower decoding operation with a lower average power consumption.

In a particular embodiment, the video decoder system with a dynamic switch to select a decoding path based on a decoding metric 664 includes first means for decoding the encoded high-definition video signal 668 and second means for decoding the encoded high-definition video signal 668 at a slower average speed than the first means and using less average power than the first means. The video decoder system with a dynamic switch to select a decoding path based on a decoding metric 664 may also include a selection circuit to dynamically select the first means or the second means in response to a number of undecoded coefficients of a macroblock of the high-definition video signal 668 and further in response to a number of remaining processing cycles available to decode the undecoded coefficients of the macroblock. As an example, the first means may include the first decoding path 220 with the first lookup table 222 storing the first set of codewords 224, and the second means may include the second decoding path 240 with the second lookup table 242 storing the second set of codewords 244, as illustrated in FIG. 2. As another example, the first means may include the first lookup table 322 storing the first set of codewords 324, and the second means may include the second lookup table 342 storing the second set of codewords 344, as illustrated in FIG. 3.

As yet another example, the first means and the second means may be incorporated in a decoding pipeline including a first pipeline stage to determine coefficients of a particular macroblock of the high-definition signal and a second pipeline stage to receive the coefficients of the particular macroblock determined at the first pipeline stage and to reconstruct the high-definition video signal using the coefficients of the particular macroblock, such as the decoding pipeline 400 of FIG. 4. The first means may correspond to the first lookup table 422, the second lookup table 442, or both, and the second means may correspond to the third lookup table 462, the second lookup table 442, or both. Alternatively, the first and second means for decoding may include other structures that enable data storage and retrieval, such as one or more memory devices, registers, caches, latches, flip-flops, state machines, programmable arrays, or other circuits or circuit devices, hardware, firmware, or any combination thereof.

In a particular embodiment, the processor 610, the display controller 626, the memory 632, the CODEC 634, the wireless controller 640, and the video decoder system with a dynamic switch to select a decoding path based on a decoding metric 664 are included in a system-in-package or system-on-chip device 622. In a particular embodiment, an input device 630 and a power supply 644 are coupled to the system-on-chip device 622. Moreover, in a particular embodiment, as illustrated in FIG. 6, the display device 628, the input device 630, the speaker 636, the microphone 638, the wireless antenna 642, and the power supply 644 are external to the system-on-chip device 622. However, each of the display device 628, the input device 630, the speaker 636, the microphone 638, the wireless antenna 642, and the power supply 644 can be coupled to a component of the system-on-chip device 622, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A system comprising:
   a video decoder system configured to receive an encoded video signal and to output a decoded video signal, the video decoder system including:
   a first decoding path configured to access a first lookup table storing first data corresponding to a complete set of codewords of a variable length coding scheme;
   a second decoding path configured to access the first lookup table and a second lookup table storing second data corresponding to an incomplete set of codewords, wherein the second decoding path is configured to access the second lookup table prior to accessing the first lookup table such that the second decoding path is configured to decode at a slower average rate than the first decoding path; and
   a dynamic switch configured to provide a first portion of the encoded video signal to the first decoding path or to the second decoding path, the dynamic switch further configured to provide a subsequent portion of the encoded video signal to the first decoding path or to the second decoding path in response to a value of a decoding metric associated with decode processing of the first portion of the encoded video signal, wherein the decoding metric indicates a relationship between an amount of data remaining to be decoded and an amount of time or a number of clock cycles available to decode the data remaining to be decoded.

2. The system of claim 1, wherein the second decoding path is configured to use less average power than the first decoding path due to the second lookup table including codewords that are statistically likely to be received and due to the second lookup table being accessed prior to the first lookup table in the second decoding path.

3. The system of claim 1, wherein the encoded video signal includes coefficients representing frequency transformed pixels, and wherein the decoding metric is determined based on an amount of time available to decode remaining coefficients of the encoded video signal.

4. The system of claim 3, further comprising decoding metric logic configured to generate the decoding metric based on decoding the first portion by reducing the amount of time available by a number of clock cycles used to decode the first portion and by reducing a remaining coefficient count by a number of coefficients of the first portion.

5. The system of claim 1, further comprising:
a wireless controller configured to receive the encoded video signal via an antenna;
a memory to store the encoded video signal; and
a display controller configured to provide the decoded video signal that is output by the video decoder system to a display device.

6. The system of claim 1,
wherein the first portion and the subsequent portion correspond to codewords of a variable length coding scheme,
wherein the decoding metric is updated as each codeword is decoded, and
wherein the dynamic switch is configured to select the first decoding path or the second decoding path to decode a particular codeword in response to a value of the decoding metric after decoding a previous codeword.

7. The system of claim 6, wherein the encoded video signal includes macroblocks of a high-definition video signal, and wherein the dynamic switch is configured to dynamically switch from the first decoding path to the second decoding path while decoding a particular macroblock when sufficient processing cycles are available to decode at the slower average rate while maintaining a data output rate to support high-definition display of decoded video signal.

8. The system of claim 1, wherein the video decoder system further comprises:
a bitstream parser configured to output coefficient data corresponding to codewords of a variable length coding scheme of the encoded video signal, wherein the bitstream parser includes the dynamic switch;
an internal memory configured to store the coefficient data corresponding to a particular macroblock of a high-definition video signal; and
a pixel processor configured to access the internal memory to reconstruct the particular macroblock of the decoded video signal using the coefficient data,
wherein the bitstream parser and the pixel processor are implemented as separate stages of a macroblock decoder pipeline.

9. The system of claim 1, wherein the incomplete set of codewords includes codewords that are statistically likely to be received.

10. A method comprising:
receiving an encoded video signal at a video decoder system;
sending a first portion of the encoded video signal to a first decoding path or a second decoding path of the video decoder system, wherein the first decoding path is configured to access a first lookup table storing first data corresponding to a complete set of codewords of a variable length coding scheme and wherein the second decoding path is configured to access the first lookup table and a second lookup table storing second data corresponding to an incomplete set of the codewords, wherein the second decoding path is configured to access the second lookup table prior to accessing the first lookup table such that the second decoding path is configured to use less average power than the first decoding path;
determining a decoding metric associated with decoding the first portion of the encoded video signal, wherein the decoding metric indicates a relationship between an amount of data remaining to be decoded and an amount of time or a number of clock cycles available to decode the data remaining to be decoded;
selectively sending a subsequent portion of the encoded video signal to the first decoding path or the second decoding path in response to the decoding metric; and
generating a decoded video signal based on decoding the first portion and the subsequent portion.

11. The method of claim 10, wherein the second decoding path is further configured to decode at a slower average rate than the first decoding path due to the second lookup table including codewords that are statistically likely to be received and due to the second lookup table being accessed prior to the first lookup table in the second decoding path.

12. The method of claim 11, wherein the subsequent portion is sent to the second decoding path when the decoding metric indicates that sufficient time is available to decode the subsequent portion at the slower average rate.

13. The method of claim 10, wherein the first portion includes at least a first codeword of a variable length encoding scheme, and wherein the subsequent portion includes at least a second codeword of a variable length coding scheme.

14. The method of claim 10, wherein the first portion and the subsequent portion correspond to a particular macroblock of the encoded video signal, and wherein the decoding metric indicates an amount of time available to decode remaining pixels of the particular macroblock to maintain a data output rate to support a high definition display of the decoded video signal.

15. The method of claim 10, further comprising:
storing decoded data corresponding to a particular macroblock generated at a first stage of a macroblock decoding pipeline to an internal memory of the macroblock decoding pipeline; and
reading the decoded data from the internal memory and reconstructing the particular macroblock at a second stage of the macroblock decoding pipeline,
wherein the first stage generates the decoded data corresponding to the particular macroblock within a predetermined amount of time while the second stage concurrently reconstructs a prior macroblock within the predetermined amount of time.

16. The method of claim 10,
wherein the incomplete set of the codewords include codewords that are statistically likely to be received; and
wherein the second decoding path uses less average power than the first decoding path due to the second lookup table including codewords that are statistically likely to be received and due to the second lookup table being accessed prior to the first lookup table in the second decoding path.

17. A system comprising:
one or more memories storing a plurality of lookup tables including:
  a first lookup table storing first data corresponding to a complete set of codewords of a variable length coding scheme; and
  a second lookup table storing second data corresponding to a first incomplete set of the codewords; and
a switch configured to receive a portion of a variable length coding bitstream that includes a first codeword and to send the first codeword to a first decoding path or a second decoding path, the switch further configured to provide a subsequent codeword to the first decoding path or the second decoding path in response to a value of a decoding metric associated with decoding the first codeword, wherein the decoding metric indicates a relationship between an amount of data remaining to be decoded and an amount of time or a number of clock cycles available to decode the data remaining to be decoded, the first decoding path configured to access the first lookup table, the second decoding path configured to access the first lookup table and the second lookup table, the second decoding path configured to access the second lookup table prior to accessing the first lookup table such that the second decoding path is configured to decode at a slower average rate than the first decoding path.

18. The system of claim 17, wherein a lookup operation at the second lookup table consumes less power than at the first lookup table and wherein the first lookup table is configured to perform a lookup operation of a particular codeword after the particular codeword is not found at the second lookup table.

19. The system of claim 18, further comprising:
a position accumulator configured to indicate a decoding position of a signal, wherein the signal is encoded in the variable length coding bitstream; and
a cycle accumulator configured to indicate a number of processing cycles that have been used to decode the variable length coding bitstream.

20. The system of claim 19, further comprising decoding metric logic configured to determine the value of the decoding metric using the decoding position and the number of processing cycles.

21. The system of claim 20,
wherein the variable length coding bitstream includes an encoded high-definition video signal having a plurality of macroblocks, and
wherein the decoding metric logic is configured to initialize the position accumulator and the cycle accumulator at each macroblock.

22. The system of claim 21,
wherein the plurality of lookup tables further includes a third lookup table storing third data corresponding to a second incomplete set of the codewords, and
wherein when the particular codeword is not stored at the third lookup table, the particular codeword is sent to the first lookup table or to the second lookup table.

23. The system of claim 17, where the incomplete set of codewords includes codewords that are statistically likely to be received.

24. A portable electronic device comprising:
a wireless controller configured to receive an encoded high-definition video signal via an antenna;
first means for decoding the encoded high-definition video signal, wherein the first means is configured to access a first lookup table storing first data corresponding to a complete set of codewords of a variable length coding scheme;
second means for decoding the encoded high-definition video signal at a slower average speed than the first means for decoding and using less average power than the first means for decoding, wherein the second means is configured to access the first lookup table and a second lookup table storing second data corresponding to an incomplete set of the codewords, wherein the second means is configured to access the second lookup table prior to accessing the first lookup table; and
a selection circuit to dynamically select the first means for decoding or the second means for decoding in response to a number of undecoded coefficients of a macroblock of the encoded high-definition video signal and further in response to a number of remaining processing cycles available to decode the undecoded coefficients of the macroblock, wherein the selection circuit is configured to select the first means for decoding or the second means for decoding to decode a particular portion of the macroblock based on decode processing of at least one prior portion of the macroblock.

25. The portable electronic device of claim 24, wherein the first means for decoding and the second means for decoding are implemented in a decoding pipeline, the decoding pipeline comprising:
a first pipeline stage to determine coefficients of a particular macroblock of the encoded high-definition video signal; and
a second pipeline stage to receive the coefficients of the particular macroblock determined at the first pipeline stage and to reconstruct the high-definition video signal using the coefficients of the particular macroblock.

26. The portable electronic device of claim 24, wherein the incomplete set of codewords includes codewords that are statistically likely to be received.

* * * * *